United States Patent
McLaughlin et al.

(10) Patent No.: US 10,090,879 B2
(45) Date of Patent: Oct. 2, 2018

(54) RECEIVER FOR USE IN AN ULTRA-WIDEBAND COMMUNICATION SYSTEM

(71) Applicants: Michael McLaughlin, Dublin (IE); Billy Verso, Maynooth (IE); Tony Proudfoot, Bray (IE)

(72) Inventors: Michael McLaughlin, Dublin (IE); Billy Verso, Maynooth (IE); Tony Proudfoot, Bray (IE)

(73) Assignee: Decawave, Ltd., Dublin (IE)

( * ) Notice: Subject to any disclaimer, the term of this patent is extended or adjusted under 35 U.S.C. 154(b) by 0 days.

(21) Appl. No.: 15/505,378

(22) PCT Filed: Nov. 10, 2014

(86) PCT No.: PCT/EP2014/074169
§ 371 (c)(1),
(2) Date: Feb. 21, 2017

(87) PCT Pub. No.: WO2016/023600
PCT Pub. Date: Feb. 18, 2016

(65) Prior Publication Data
US 2017/0272119 A1 Sep. 21, 2017

Related U.S. Application Data

(60) Continuation-in-part of application No. 14/290,956, filed on May 29, 2014, which is a division of
(Continued)

(51) Int. Cl.
*H04B 1/7097* (2011.01)
*H04B 1/7163* (2011.01)
(Continued)

(52) U.S. Cl.
CPC .......... *H04B 1/7097* (2013.01); *H04B 1/709* (2013.01); *H04B 1/7073* (2013.01);
(Continued)

(58) Field of Classification Search
CPC .. H04B 1/7097; H04B 1/71637; H04B 1/709; H04B 1/7073; H04L 27/38; H03D 3/00; G06F 17/15
See application file for complete search history.

(56) References Cited

U.S. PATENT DOCUMENTS

| | | | |
|---|---|---|---|
| 8,948,311 B2* | 2/2015 | Pietrzyk | H04B 1/71637 375/316 |
| 9,084,087 B2* | 7/2015 | Ekbatani | H04W 4/04 |

(Continued)

FOREIGN PATENT DOCUMENTS

WO WO 2009/143559 A1 12/2009

OTHER PUBLICATIONS

Sahinoglu Z, et al. "Threshold-Based TOA Estimation for Impulse Radio UWB System", Ultra-Wideband, 2005 IEEE International Conference, pp. 420-425, Sep. 5, 2005.
(Continued)

*Primary Examiner* — Kenneth Lam
(74) *Attorney, Agent, or Firm* — Hunt Pennington Kumar & Dula, PLLC; Artie Pennington; Jeffrey Van Myers

(57) ABSTRACT

In an ultra-wideband ("UWB") receiver, a received UWB signal is periodically digitized as a series of ternary samples. The samples are continuously correlated with a predetermined preamble sequence to develop a correlation value. When the value exceeds a predetermined threshold, indicating that the preamble sequence is being received, a stream of estimates of the channel impulse response ("CIR") are developed. When a start-of-frame delimiter ("SFD") is detected, the best CIR estimate is provided to a channel
(Continued)

matched filter ("CMF") substantially to filter channel-injected noise. The time of arrival of the first arriving path is developed from the stream of CIR estimates.

7 Claims, 9 Drawing Sheets

Related U.S. Application Data application No. 13/775,282, filed on Feb. 25, 2013, now Pat. No. 8,760,334, which is a continuation-in-part of application No. 13/033,098, filed on Feb. 23, 2011, now Pat. No. 8,436,758, said application No. 13/775,282 is a continuation-in-part of application No. 12/885,517, filed on Sep. 19, 2010, now Pat. No. 8,437,432.

(60) Provisional application No. 61/316,299, filed on Mar. 22, 2010, provisional application No. 62/037,020, filed on Aug. 13, 2014.

(51) Int. Cl.
*H04B 1/709* (2011.01)
*H04B 1/7073* (2011.01)
*G06F 17/15* (2006.01)
*H03D 3/00* (2006.01)
*H04L 27/38* (2006.01)

(52) U.S. Cl.
CPC ......... *H04B 1/71637* (2013.01); *G06F 17/15* (2013.01); *H03D 3/00* (2013.01); *H04L 27/38* (2013.01)

(56) References Cited

U.S. PATENT DOCUMENTS

| | | | |
|---|---|---|---|
| 2007/0036241 A1* | 2/2007 | Sahinoglu | G01S 5/0221 375/317 |
| 2009/0021420 A1* | 1/2009 | Sahinoglu | G01S 5/0221 342/135 |
| 2011/0286505 A1* | 11/2011 | Hedley | G01S 5/0205 375/224 |
| 2013/0163638 A1* | 6/2013 | McLaughlin | H04B 1/7097 375/130 |

OTHER PUBLICATIONS

Andrea Giorgetti, et al., "Time-of-Arrival Estimation Based on Information Theoretic Criteria", IEEE Transactions on Signal Processing, v. 61, No. 8, pp. 1869-1879, Apr. 1, 2013.

* cited by examiner

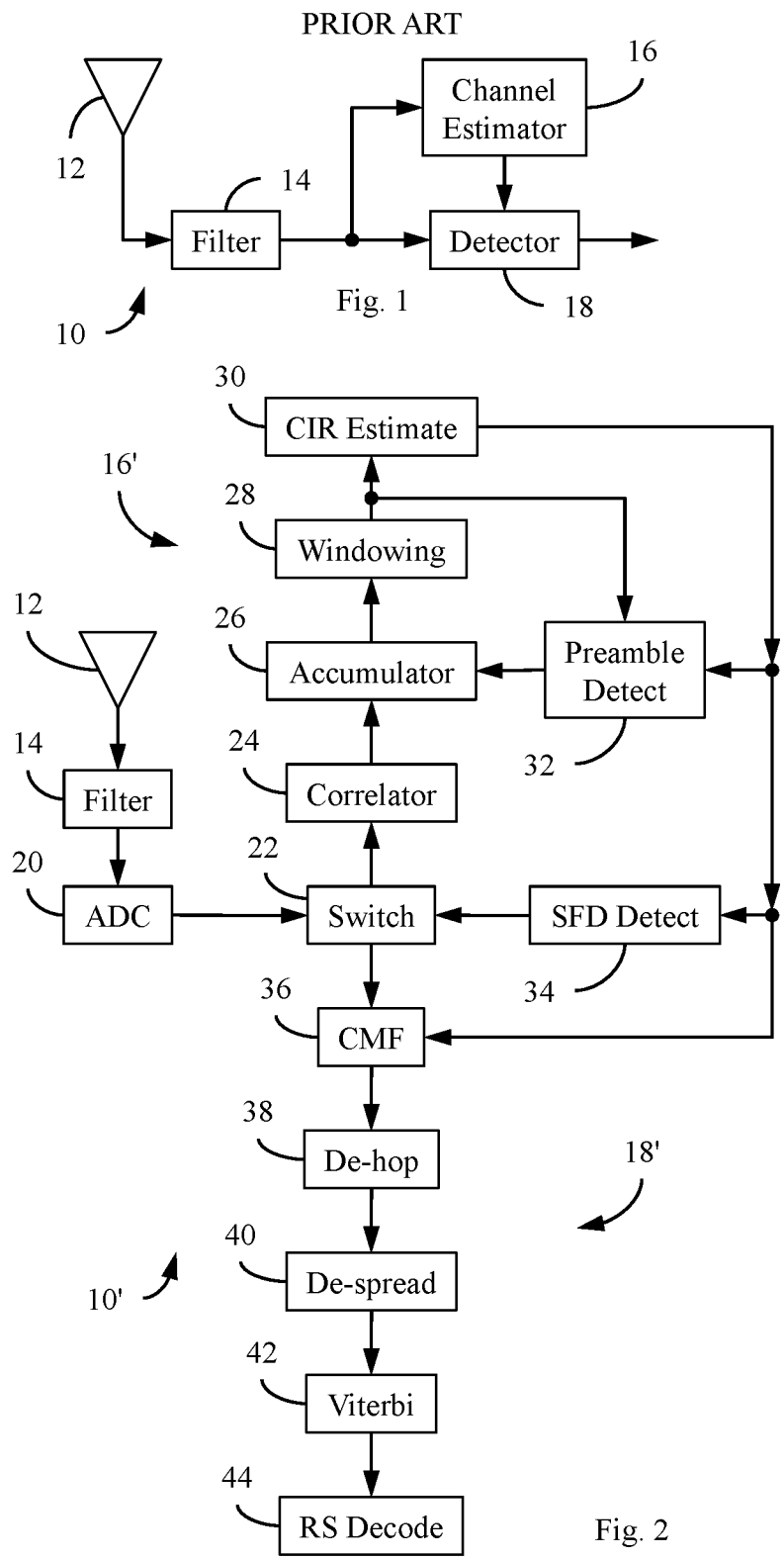

RECEIVER FOR USE IN AN ULTRA-WIDEBAND COMMUNICATION SYSTEM

CROSS-REFERENCE TO RELATED APPLICATIONS

This application is a Continuation-In-Part of application Ser. No. 14/290,956, filed 29 May 2014 ("Parent Application").

The Parent Application is, in turn, a Division of application Ser. No. 13/775,282, filed 25 Feb. 2013, now U.S. Pat. No. 8,760,334, issued 24 Jun. 2014 ("First Parent Patent"). Related Application One is, in turn, a Continuation-In-Part of application Ser. No. 13/033,098, filed 23 Feb. 2011, now U.S. Pat. No. 8,436,758, issued 7 May 2013 ("Second Parent Patent"), which is in turn related to Provisional Application Ser. No. 61/316,299, filed 22 Mar. 2010 ("First Parent Provisional").

Related Application One is also, in turn, a Continuation-In-Part of application Ser. No. 12/885,517, filed 19 Sep. 2010, now U.S. Pat. No. 8,437,432, issued 7 May 2013 ("Third Parent Patent"), which is also in turn related to the First Parent Provisional.

This application is also related to Provisional Application Ser. No. 62/037,020, filed 13 Aug. 2014 ("Second Parent Provisional").

This application claims priority to:
1. The Parent Application;
2. The First, Second and Third Parent Patents;
3. The First and Second Parent Provisionals; and
4. The Related Application;
collectively, "Related References", and hereby claims benefit of the filing dates thereof pursuant to 37 CFR § 1.78(a)(4).

The subject matter of each of the Related References, in its entirety, is expressly incorporated herein by reference.

BACKGROUND OF THE INVENTION

1. Field of the Invention

The present invention relates generally to ultra-wideband communication systems, and, in particular, to a receiver for use in an ultra-wideband communication system.

2. Description of the Related Art

In general, in the descriptions that follow, we will italicize the first occurrence of each special term of art which should be familiar to those skilled in the art of ultra-wideband ("UWB") communication systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

In general, in an ultra-wideband ("UWB") communication system, a series of special processing steps are performed by a UWB transmitter to prepare payload data for transmission via a packet-based UWB channel. Upon reception, a corresponding series of reversing steps are performed by a UWB receiver to recover the data payload. Details of both series of processing steps are fully described in IEEE Standards 802.15.4 ("802.15.4") and 802.15.4a ("802.15.4a"), copies of which are submitted herewith and which are expressly incorporated herein in their entirety by reference. As is known, these Standards describe required functions of both the transmit and receive portions of the system, but specify implementation details only of the transmit portion of the system, leaving to implementers the choice of how to implement the receive portion.

One particular problem in multi-path, spread-spectrum systems, including UWB, is channel-induced noise present in the received signal. One common technique for significantly reducing the noise level relative to the receive level is to develop, during reception of a training sequence portion of the preamble of each transmitted packet, an estimate of the channel impulse response ("CIR"). As is known, each CIR estimate comprises a set of coefficients representing the impulse response of the channel. Following detection in the received packet of the start-of-frame delimiter ("SFD"), the best CIR estimate is reversed in time and the complex conjugate is developed. This conjugate CIR estimate is thereafter convolved with the payload portion of the packet using a channel matched filter ("CMF"). Shown in FIG. 1 is a UWB receiver 10 adapted to operate in this manner. As is known, the signal received via an antenna 12 is continuously conditioned by a filter 14. During reception of the training sequence, channel estimator 16 develops from the conditioned signal the conjugate CIR estimate. During reception of the payload data, detector 18 employs a CMF (not shown) to convolve the conditioned signal with the conjugate CIR estimate, thereby significantly improving the signal-to-noise ratio ("SNR") and facilitating recovery of the payload data. See, also, "Efficient Back-End Channel Matched Filter (CMF)", U.S. Pat. No. 7,349,461, issued 25 Mar. 2008.

As noted in 802.15.4a, § 5.5.7.1, "UWB devices that have implemented optional ranging support are called ranging-capable devices (RDEVs)." (Emphasis in original.) For certain applications, such RDEVs are commonly implemented in the form of a relatively compact, autonomous radio-frequency identification ("RFID") tag or the like. Due to the small form factor and limited power supply, it is especially important to select circuit implementations that provide maximum performance at minimum power. Unfortunately, in known implementations of the UWB receiver, improvements in performance usually come at the expense of power. For example, it is known that a rake filter provides good performance in multi-path, spread-spectrum systems such as UWB. See, e.g., slide 21 of "The ParthusCeva Ultra Wideband PHY Proposal", *IEEE P*802.15 *Working Group for Wireless Personal Area Networks*, March 2003, a copy of which is submitted wherewith and which is expressly incorporated herein in its entirety by reference. However, known rake filter implementations tend to consume significantly more power than other prior art techniques.

While it has been proposed to implement the front-end of a spread-spectrum receiver using a fast, 1-bit analog-to-data converter ("ADC") to reduce the size (in terms of transistor count) of the convolution logic in both the CIR estimator and the CMF, such implementations are known to be particularly sensitive to continuous-wave ("CW") interference. This CW interference can be substantially rejected using a full 2-bit, sign+magnitude implementation such as that described by F. Amoroso in "Adaptive A/D Converter to Suppress CW Interference in DSPN Spread-Spectrum Communications", *IEEE Trans. on Communications*, vol. COM-31, No. 10, October 1983, pp. 1117-1123 ("Amoroso83"), a copy of which is submitted wherewith and which is expressly incorporated herein in its entirety by reference. However, in such implementations, having dual representations of the 0-state, i.e., [−0, +0], tend to increase system entropy, resulting in less-than-optimal circuit/power efficiency.

As is known, 802.15.4a provides for a precision ranging capability. As is also known, distinguishing the different multipath components that compose a received UWB signal is often difficult yet necessary for accurate ranging estimates. Noise, multipath components, obstacles, interference and clock drift may affect received UWB signals. In dense multipath channels, it is often challenging to distinguish the first path, i.e., the most direct path by which transmitted energy first arrives at the receiver 10'.

We submit that what is needed is an improved method and apparatus for use in the receiver of a UWB communication system to determine the first path. In particular, we submit that such a method and apparatus should provide performance generally comparable to the best prior art techniques while requiring less circuitry and consuming less power than known implementations of such prior art techniques.

BRIEF SUMMARY OF THE INVENTION

In accordance with a preferred embodiment of our invention, we provide in one embodiment a method for use in an ultra-wideband (UWB) communication system in which multi-symbol packets are transmitted via a transmission channel, the method comprising the steps of developing an estimate comprising a first set of coefficients of a channel impulse response (CIR) of the transmission channel; selecting a second set of the coefficients comprising a noise region preceding a leading edge of the CIR; calculating a first statistic as a function of the first and second sets of coefficients; calculating a first path threshold as a function of the first statistic; and selecting a first window within the first set of coefficients surrounding a first one of the first set of coefficients having a value above the first path threshold.

In one other embodiment, our method is practiced in a receiver specially adapted for use in a UWB communication system.

In another embodiment, our method is embodied, in whole or in part, in a non-transient computer readable medium including executable instructions which, when executed by a computer specially adapted for use in a UWB communication system, cause the computer to perform our method.

We submit that each of these embodiments of our invention determine the first path as effectively as any prior art method or apparatus now known to us, while consuming less power.

BRIEF DESCRIPTION OF THE SEVERAL VIEWS OF THE DRAWINGS

Our invention may be more fully understood by a description of certain preferred embodiments in conjunction with the attached drawings in which:

FIG. 1 illustrates, in block diagram form, a prior art receiver adapted for use in a UWB communication system;

FIG. 2 illustrates, in block diagram form, one embodiment of the receiver shown in FIG. 1, but constructed in accordance with our invention;

FIG. 4, comprising

Figure 3:
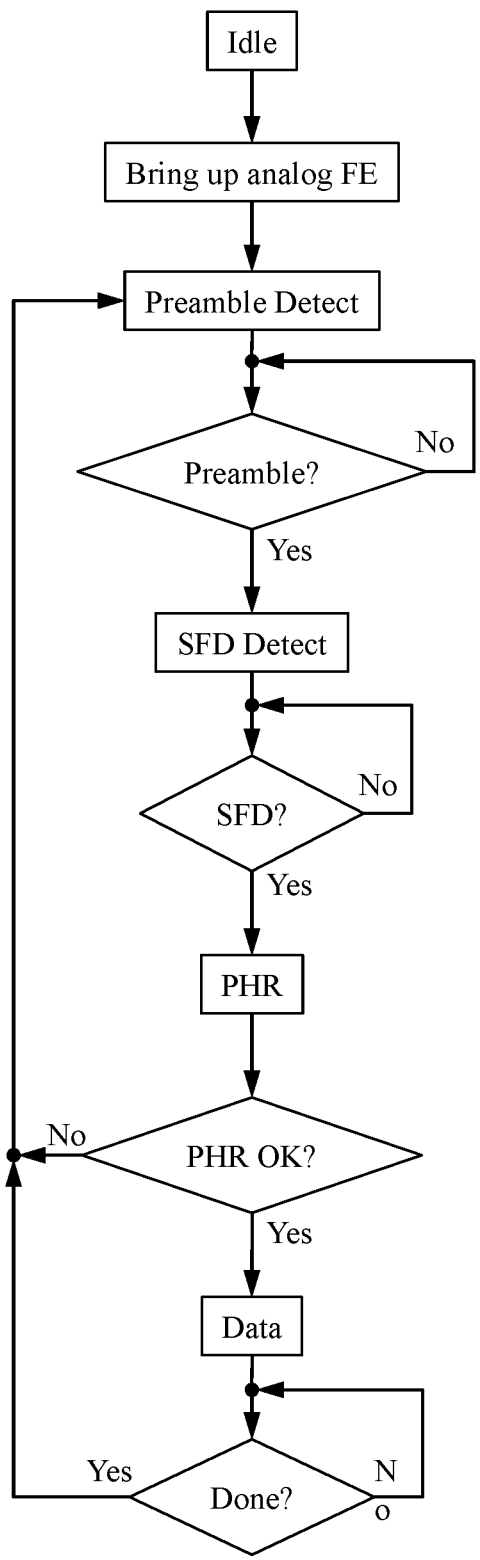
FIG. 3 illustrates, in flow diagram form, operation of the correlator block shown in FIG. 2.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Shown in FIG. 2 is a UWB receiver 10' constructed in accordance with our invention. As in the prior art system shown in FIG. 1, the signal received by antenna 12 is continuously conditioned by filter 14. The conditioned signal is then periodically sampled by an analog-to-digital converter ("ADC") 20 and provided as a continuous series of digital samples. In accordance with a preferred embodiment of our invention, ADC 20 is specially adapted to provide each digital sample in ternary form, i.e., [−1, 0, +1]. In view of the difficulty of currently available standard digital circuit technology efficiently to represent a 3-value variable in the form of a single ternary trit, we anticipate, at least in the near term, such variables will require representation using 2 conventional, binary bits, wherein a first one of the bits represents the numeric component of the variable, i.e., [0, 1], and the second bit represents the sign of the variable, i.e., [+, −]. In this regard, it could be argued that circuit technology has not progressed all that much since Soviet researchers built the first (perhaps only?) documented ternary-based computer systems. See, "*A Visit to Computation Centers in the Soviet Union*," Comm. of the ACM, 1959, pp. 8-20; and "*Soviet Computer Technology—1959*", Comm. of the ACM, 1960, pp. 131-166; copies of which are submitted herewith and which are expressly incorporated herein in their entirety by reference.

In the context of our invention, our trit can be distinguished from a conventional sign+magnitude implementation such as that described in Amoroso83, cited above. Consider the strategy for A/D conversion shown in FIG. 5 of Amoroso83; and, note, especially, that there are three separate and distinct switching thresholds: (i) a sign threshold $[T_0]$; (ii) a positive magnitude threshold $[T_0+\Delta]$; and (iii) a negative magnitude threshold $[T_0-\Delta]$. (See, also, Amoroso83, p. 1119, lines 21-24.) We have discovered that adapting the ADC to use ONLY a positive magnitude threshold $[T_0+\Delta]$ and a negative magnitude threshold $[T_0-\Delta]$ results in only a very small loss in resolution, while improving the performance of an impulse radio UWB receiver. Accordingly, in our preferred embodiment, ADC 20 implements only positive/negative magnitude thresholds $[T_0\pm\Delta]$, thereby simplifying the circuit while simultaneously improving both the conversion time of the ADC 20 and, in general, the performance of the receiver. Such an implementation lends itself naturally to our trit-based scheme, wherein the three defined states indicate, for example, that:

[−1]=>the input is below the negative magnitude threshold $[T_0−\Delta]$;

[0]=>the input is between the negative magnitude threshold $[T_0−\Delta]$ and the positive magnitude threshold $[T_0+\Delta]$; and

[+1]=>the input is above the positive magnitude threshold $[T_0+\Delta]$.

In contrast to a conventional sign+magnitude implementation, our trit-based ADC 20 can be readily adapted to operate either at a higher sample rate (improved performance but with more power) or at an equivalent sample rate (substantially equivalent performance but with less complexity, thereby reducing both circuit size and power consumption).

Upon power-on, a switch 22 will be configured to direct the trit sample stream to a correlator 24 portion of channel estimator 16'. In one embodiment, correlator 24 is adapted to correlate the sample stream with the known training sequence, and periodically to provide a partial finite impulse response ("FIR") for each symbol. An accumulator 26 is provided to accumulate the partial FIRs on a per-symbol basis for some or all of the symbols comprising the synchronization header ("SHR").

Windowing 28 is provided to selectively develop a CIR estimate based on a selected, sliding subset, i.e., window, of the accumulated per-symbol FIRs. When a sufficient number of per-symbol FIRs have been accumulated, windowing 28 develops an initial CIR estimate 30. In one embodiment, windowing 28 is adapted thereafter to periodically develop new CIR estimates as symbols slide through the window.

A preamble detect 32 correlates each new CIR estimate with the CIR estimate 30. In the event that preamble detect 32 determines that the new CIR estimate sufficiently resembles CIR estimate 30, then preamble detect 32 signals that the preamble has been detected. If, however, the new CIR estimate does not sufficiently resemble the CIR estimate 30, preamble detect 32 stores the new CIR estimate as CIR estimate 30. In one embodiment, preamble detect 32 is adapted to reset accumulator 26 each time a new CIR estimate 30 is stored, thereby facilitating development of the CIR estimate 30 using only trit samples from selected portions of the preamble of the received packet.

As is known, the predefined SFD code comprises a predetermined set of $N_{SFD}$ symbols. Once a predetermined minimum number of symbols have been received and continuing for each subsequent preamble symbol, an SFD detect 34 correlates the SFD detection code with the accumulated FIRs of the $N_{SFD}$ most recently received symbols. In one embodiment, SFD detect 34 is adapted to configure switch 22 so as to direct the trit sample stream to a CMF 36 portion of detector 18' when the SFD detection correlation exceeds a selected threshold, indicating that the full SHR has been received and the PHY header is immediately to follow.

In accordance with our invention, the CIR estimate 30 as of the moment of SFD detection comprises the best estimate of the impulse response of the channel. In one embodiment, windowing 28 is adapted to provide an index indicative of the portion of accumulator 26 upon which the final CIR estimate 30 was based. In effect, the index indicates the portion of the accumulator containing the most energy, which, in most cases, also contains the path with the highest energy, i.e., the peak path. In a ranging application, the portion of accumulator 26 immediately preceding the index can be analyzed, e.g., using interpolation, to identify the direct path.

In one embodiment, CMF 36 is adapted to correlate the received trit sample stream with the final, i.e., best, CIR estimate 30, thereby filtering the CIR noise from the sample stream. The filtered sample stream is then processed in a known manner by De-hop 38, De-spread 40, Viterbi 42 and Reed-Solomon ("RS") decode 44 to recover the data payload.

FIG. 3 illustrates, in flow diagram form, the general method of operation of the UWB receiver 10' illustrated in FIG. 2 as described above. Details of the construction and operation of the UWB receiver 10' can be found in the Related References, all of which have been expressly incorporated herein.

As explained above and in the Related References, our accumulator 26 develops a complex estimate of the CIR by accumulating repeated ternary complex correlations of the sampled stream with a known training sequence. As is known, the CIR estimate is circular, i.e., there is no way to tell where the start is and where the end is. We have assumed that the energy will on average die away more and more towards the end of the actual CIR, so, to try to find the end, we perform a search for a point of minimum energy. We then assume that the start comes after this end. When receiving the signal, we do a time shift so that the highest energy portion of the accumulator 26 ends up at the window index which we have chosen to be around ¾ of the way along the accumulator. From this point on, the energy will decrease, but, for a long channel, it will wrap around to the start of the CIR. For this reason, we choose to ignore the start of the CIR estimate when looking for the silent period that precedes the first arriving energy in the CIR estimate. For the purpose of our calculation, we shall refer to the number of coefficients that we ignore at the start of the CIR estimate as ignoreUpto; and we shall refer to the length of the section of noise for which we are looking as noiseLength. Thus, we calculate the energy of a window of CIR coefficients at a given index, i, in the accumulator as follows:

$$\text{Energy}(i)=\text{Energy}(i-1)+\text{alpha}*(\text{mag}(I+jQ)-\text{Energy}(i-1)) \quad [\text{Eq. 1}]$$

To find the minimum value of Energy(i), we search indices between (noiseLength+1+ignore UpTo) and windowIndex, and, when found, we consider i to be the start of the noise region. The several parameters are programmable, and, by way of example, may be as follows:

alpha=1/64;

noiseLength=128; and ignoreUpTo=200

Now, we calculate the complex mean of the selected noise region, treating the quadrature estimate of the CIR resident in the accumulator 26 as a sequence of complex numbers. For convenience, we assume that the complex numbers in the noise region have a Gaussian distribution. However, noting that this distribution may have a non-zero mean due to carrier frequency offset, we calculate the complex mean of the CIR over the noise region by summing over, and then dividing by, the noiseLength. By subtracting the complex mean of the noise region from the sequence of complex values in accumulator 26 comprising the CIR estimate, we may thus treat as Gaussian variables all subsequent complex values from the noise region.

We can now calculate the magnitude of the complex values of the CIR estimate, by a well known approximation:

$$\text{magnitude} = \max(\text{abs}(I), \text{abs}(Q)) + (\tfrac{1}{4} * \min(\text{abs}(I), \text{abs}(Q))) \quad [\text{Eq. 2}]$$

These magnitudes provide an energy delay profile of the channel, and, in the noise region, the magnitude can be considered to be a Rayleigh distributed variable.

Next, we calculate the statistics of the magnitudes of the noise region:

the mean is calculated as:

$$u = \frac{\sum \text{mag\_i}}{\text{noiseLength}} \quad [\text{Eq. 3}]$$

the standard deviation is calculated as:

$$\text{StdDev} = \sqrt{\frac{\sum (u - \text{mag\_i})}{\text{noiseLength}}} \quad [\text{Eq. 4}]$$

the peak value is found as:

$$\text{PeakVal} = \max(\text{mag\_i}); \quad [\text{Eq. 5}]$$

where:
  mag_i=the sequence of magnitudes of the noise region.

In order to find the leading edge of the energy profile of the CIR, we must calculate a suitable threshold. Starting a search at noiseStart and going forward, we use the first energy value to exceed this threshold as the first path index. We develop this threshold as follows:

$$\text{firstPathThreshold} = \max(\text{peakThreshold}, n\text{StdThreshold}) \quad [\text{Eq. 6}]$$

where:
  peakThreshold=peakMultiplier*peakValue
  nStdThreshold=u+nStd*StdDev
  peakMultiplier=1.5; and
  nStd=a multiplier.

The quiet section has noise with a standard deviation of, say, Y. We know, therefore, that there are quite a few values that exceed this standard deviation, and even some by quite a large amount. By trial and error, we have found that this multiplier needs to be 7, 8, 9, 10, 11, 12 or even 13, depending on the expected environment, to reduce the likelihood of excessive noise triggering the first path search.

Having established a suitable noise threshold, i.e., firstPathThreshold, we perform a search of the magnitude data, beginning at noiseStart, and going forward in time, i.e., along the x-axis of a plot of the magnitude data. The x-value corresponding to the first energy value, i.e., the first of the prior computed magnitude values of the CIR, to exceed firstPathThreshold we select to be the first path index. Beginning with this first path index, we capture: the 3 values of magnitudes of the CIR estimate preceding the value at the index; the value at the index; and the 4 values after the value at the index—i.e., a total of 8 values comprising a window surrounding the first path index.

As we have noted above, later arriving energy associated with multipath components, noise, and interference may corrupt or smear the first path energy. Instead of the more usual method of interpolating the magnitude of the CIR estimate to find the peak of the first path in the CIR energy, we have discovered that we can achieve better results by interpolating to find the point of maximum rate of change of the leading edge of the impulse response by finding the peak of the slope of the first path in the CIR energy, i.e., the peak of the first derivative. We submit that our approach, i.e., interpolating to find the peak of the slope, substantially avoids the problem of later arriving energy smearing the first path energy.

Figure 8:
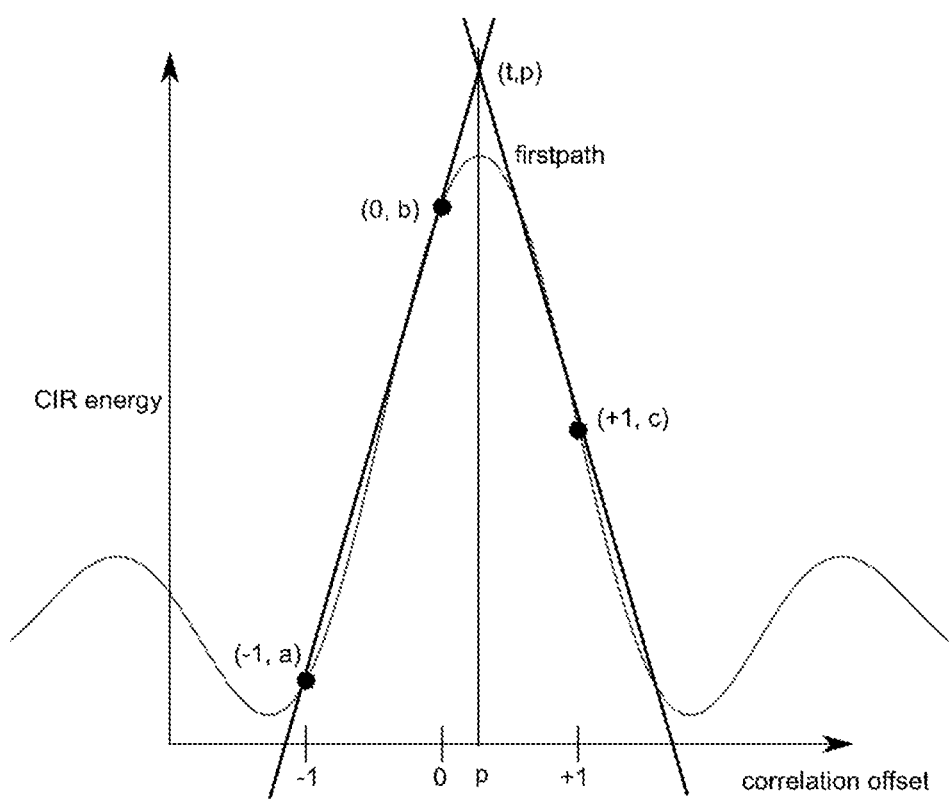
FIG. 8 illustrates, in graphical form, the triangular interpolation of the estimates of the slope of the first arriving energy in accordance with our invention.

We now compute the differences between these eight discrete magnitudes to give us seven (7) estimates of the slope of the first arriving energy. These 7 estimates comprise a subset of three (3) points that fit a triangle shape. By way of example, FIG. 8 illustrates the triangular interpolation of one sample set of estimates in a manner substantially similar to the following pseudo-code algorithm:

```
function pathPosition = ldeMatch (accumulator, index)
%
% feature match accumulator and return first path position
% get differences near the first to cross the threshold
%
accDiffs = diff(mag(accumulator (index-3:index+4)));
di = 4;
threeTaps = (accDiffs (3:5));
if accDiffs (3) > accDiffs (4) % if slope already negative
{
    di=3; % go back one
    threeTaps = (accDiffs (2:4));
    if accDiffs (2) >accDiffs (3) % if still not a triangle
    {
        di=2; % go back one more
        threeTaps = (accDiffs(1:3));
    }
}
else if accDiffs (5) > accDiffs (4) % if next one is a peak
{
    if accDiffs (5) > accDiffs (6)
    {
        di=5; % go forward one
        threeTaps = (accDiffs(di-1:di+1));
    }
    else if accDiffs (6) > accDiffs (5) % if four taps increasing
    {
        if accDiffs (7) > accDiffs (6) % if all 5 taps increasing
        {
            threeTaps = [0 1 1];
            warning('5 increasing differences in a row');
        }
        else
        {
            threeTaps = (accDiffs (di+1:di+3));
        }
        di=6;
    }
}
```

In the foregoing pseudo-code algorithm, we feature match by identifying a window of three (3) consecutive estimates wherein the first, a, and third, c, estimates are lower than the second, b, estimate. As illustrated in FIG. 8, we can use these three (x, y) points, i.e., [(−1, a) (0, b) (+1, c)], to calculate the apex (t, p) of an isosceles triangle, where:
  t is the interpolated peak magnitude of the first path of the CIR estimate; and
  p is an interpolated offset between −0.5 and 0.5 samples, calculated as:

$$p = \frac{1}{2} * \frac{c - a}{b - \min(a, c)} \quad [\text{Eq. 7}]$$

where: min(a,c) is a function that finds the smaller of the two magnitudes a and c.

In the illustrated example, the actual correlation offset of point (0, b) of the three energy points chosen for triangular interpolation represents the index of the first path to a resolution of 499.2×2 MHz. As part of symbol timing recovery in our receiver 10', the baseband input signal is delayed by a fraction of a sample. This fractional delay is used in the final timestamp correction to the index of the first path and is to a resolution of 499.2×32 MHz. As is known, the RMARKER is a defined point in the received PHY header. When the RMARKER is detected, we capture the raw timestamp. This is a 40-bit number with a resolution of 499.2/4 MHz. All component timestamps are then combined, i.e., either added or subtracted, after scaling to the same resolution, resulting in a 40-bit timestamp with a resolution of 499.2 MHz×128 (15.65 pico-seconds).

Figure 4A:
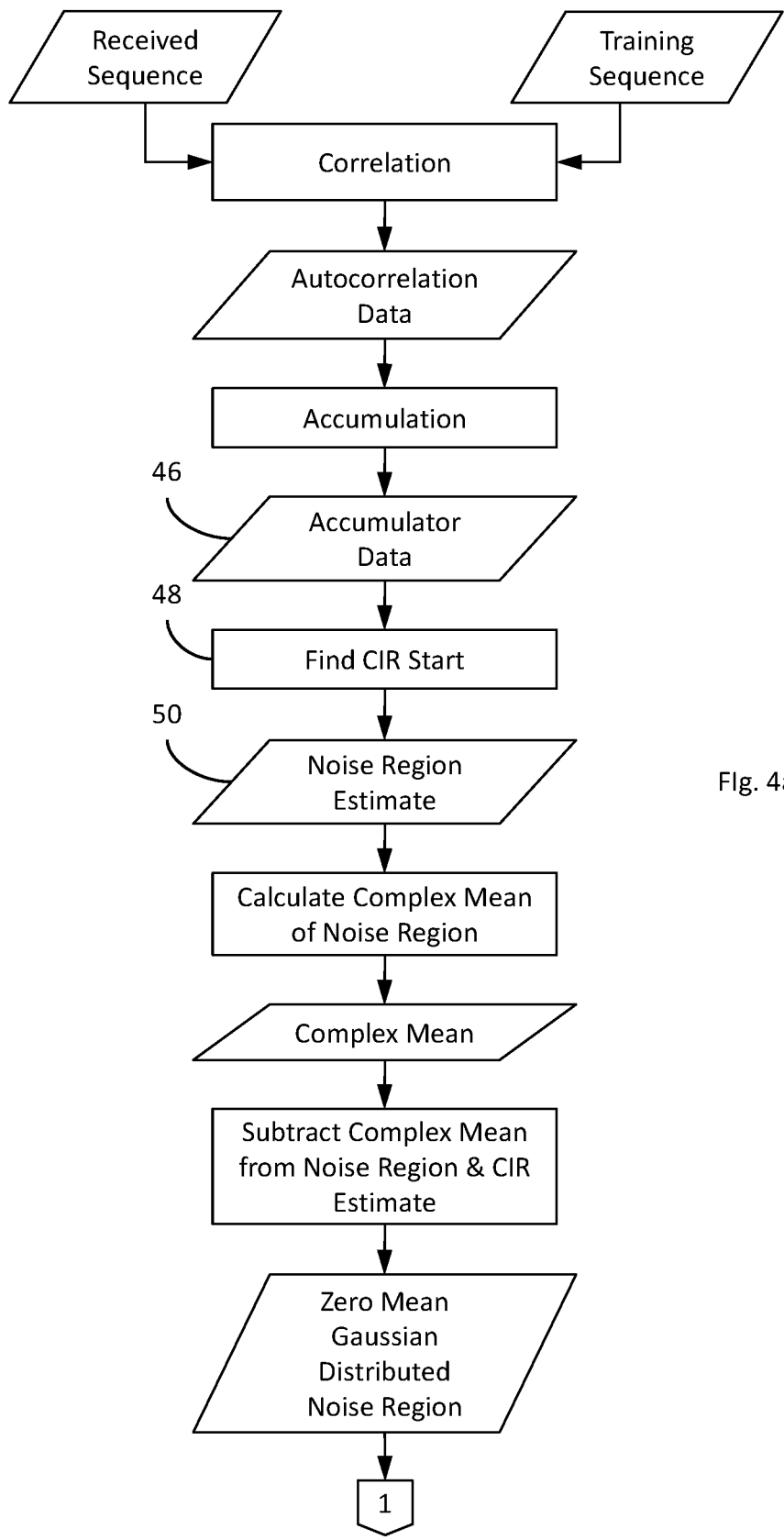
FIG. 4a, FIG. 4b, and FIG. 4c, illustrates, in flow diagram form, a method of determining the first path of a received signal using the receiver 10'.
Figure 4B:
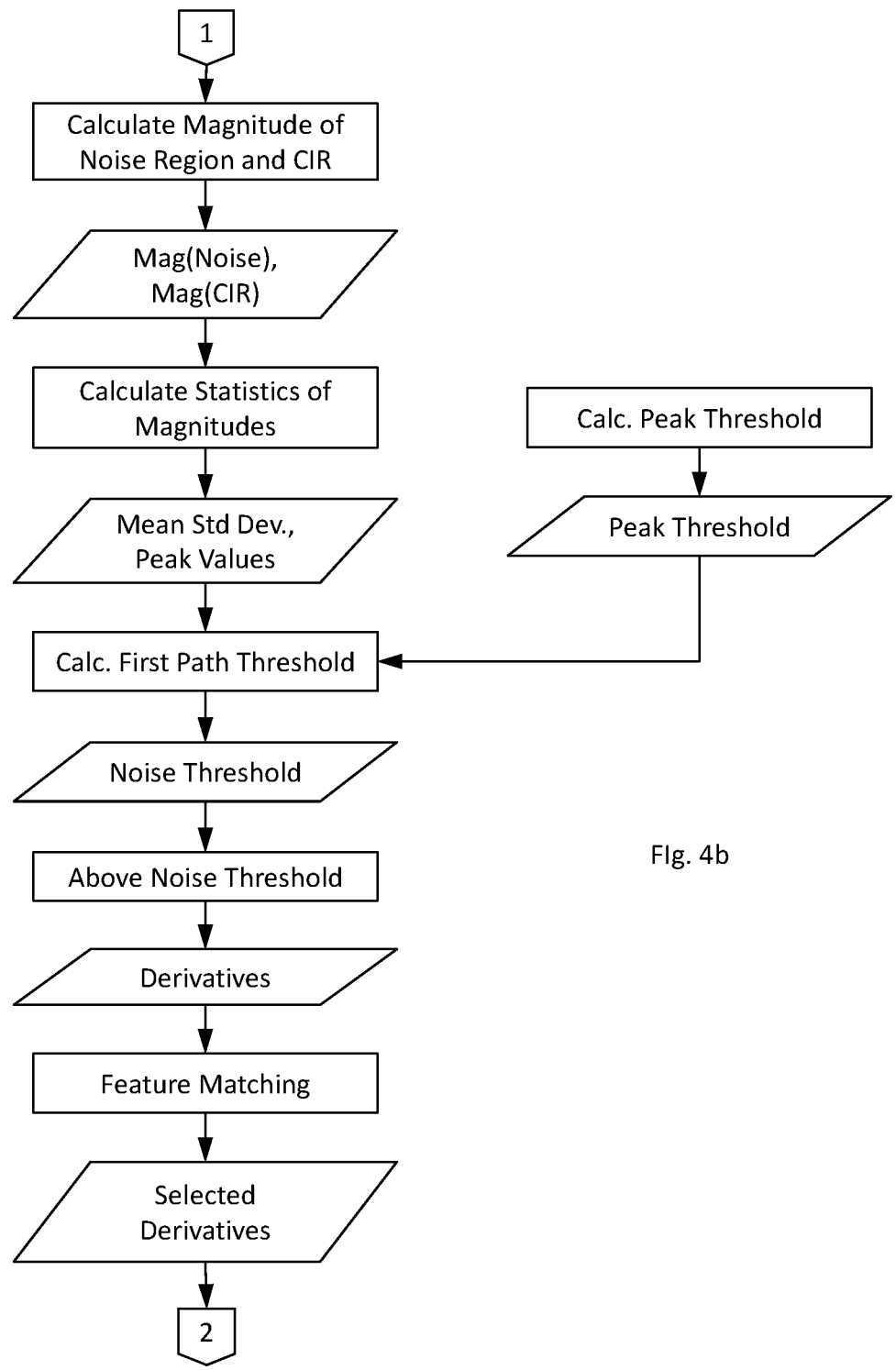
Figure 4C:
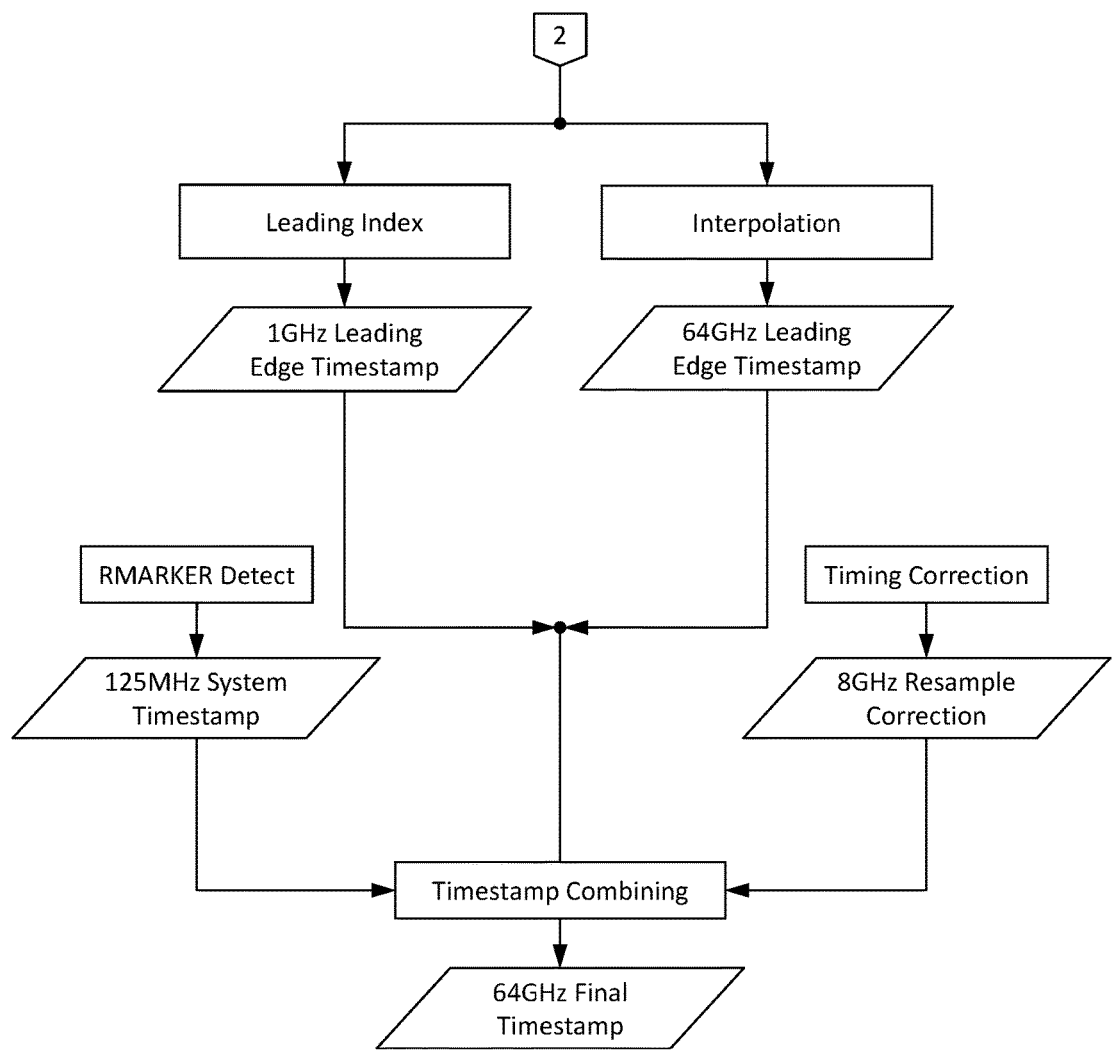

Shown in FIG. 4 by way of example is one method of determining the first path of a received signal in accordance with our invention.

Figure 5:
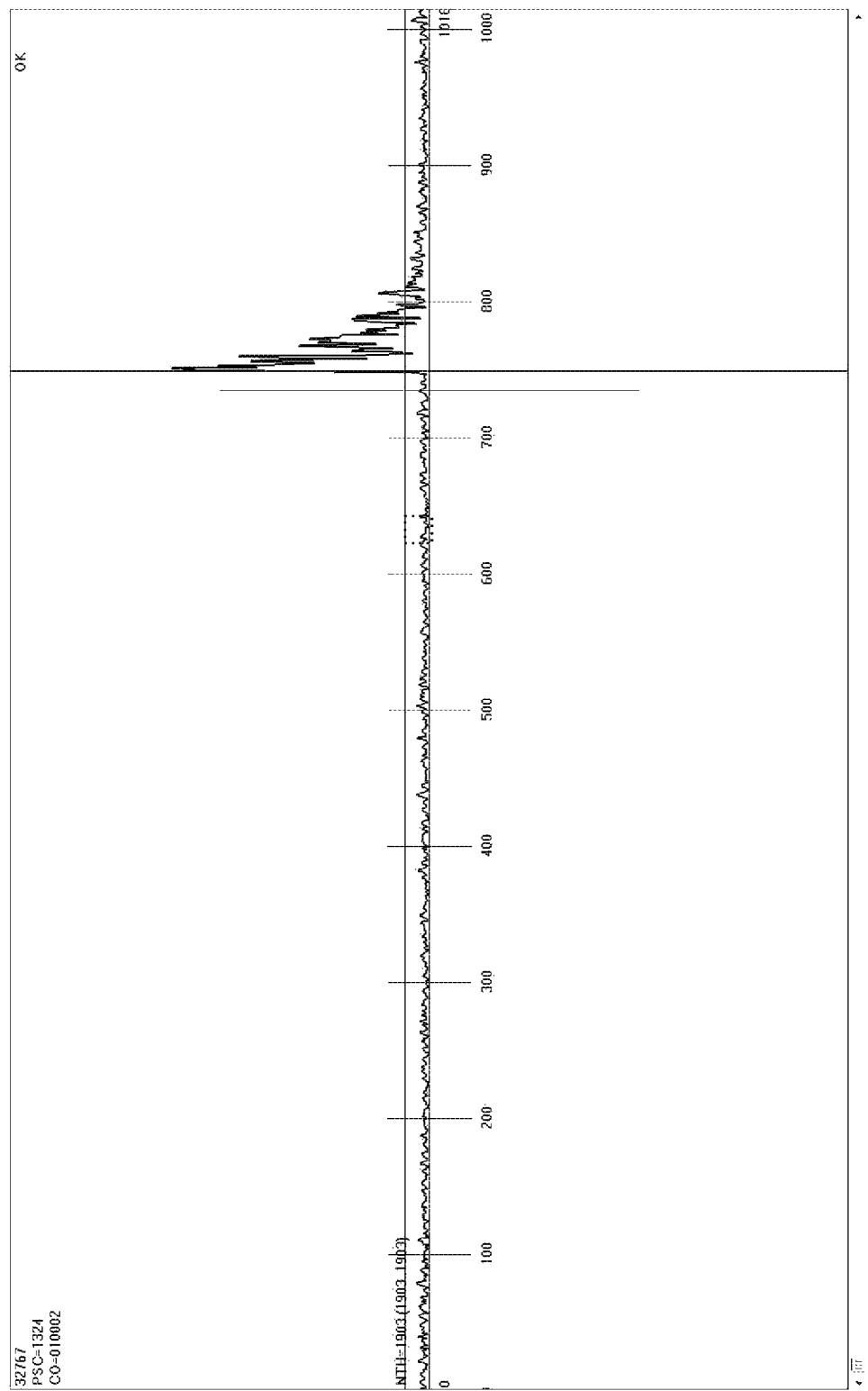
FIG. 5 illustrates, as a waveform, exemplary accumulator data resident in the accumulator 26.
Figure 6:
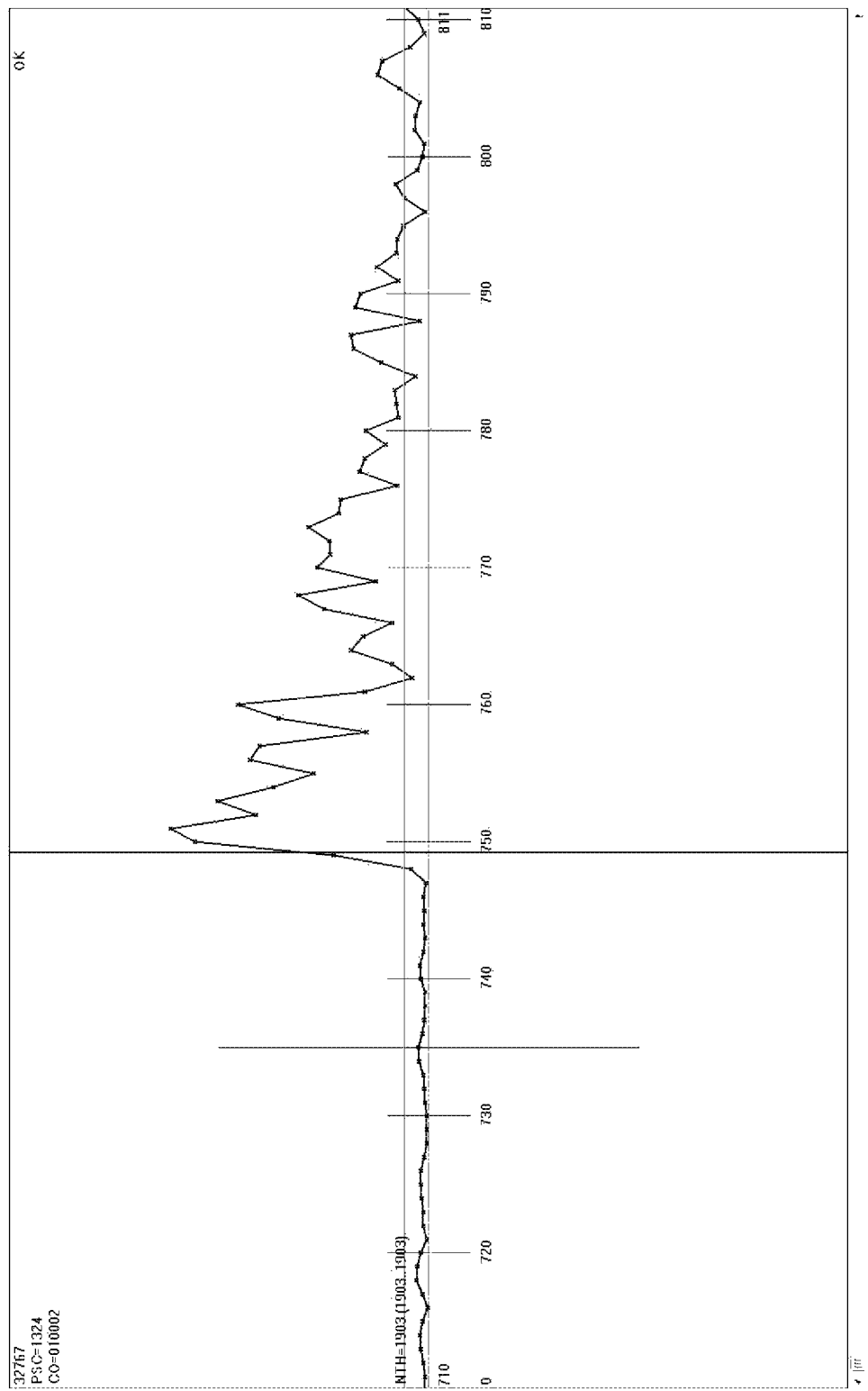
FIG. 6 illustrates, as a waveform, a zoomed-in view of the exemplary accumulator data illustrated in FIG. 5.
Figure 7:
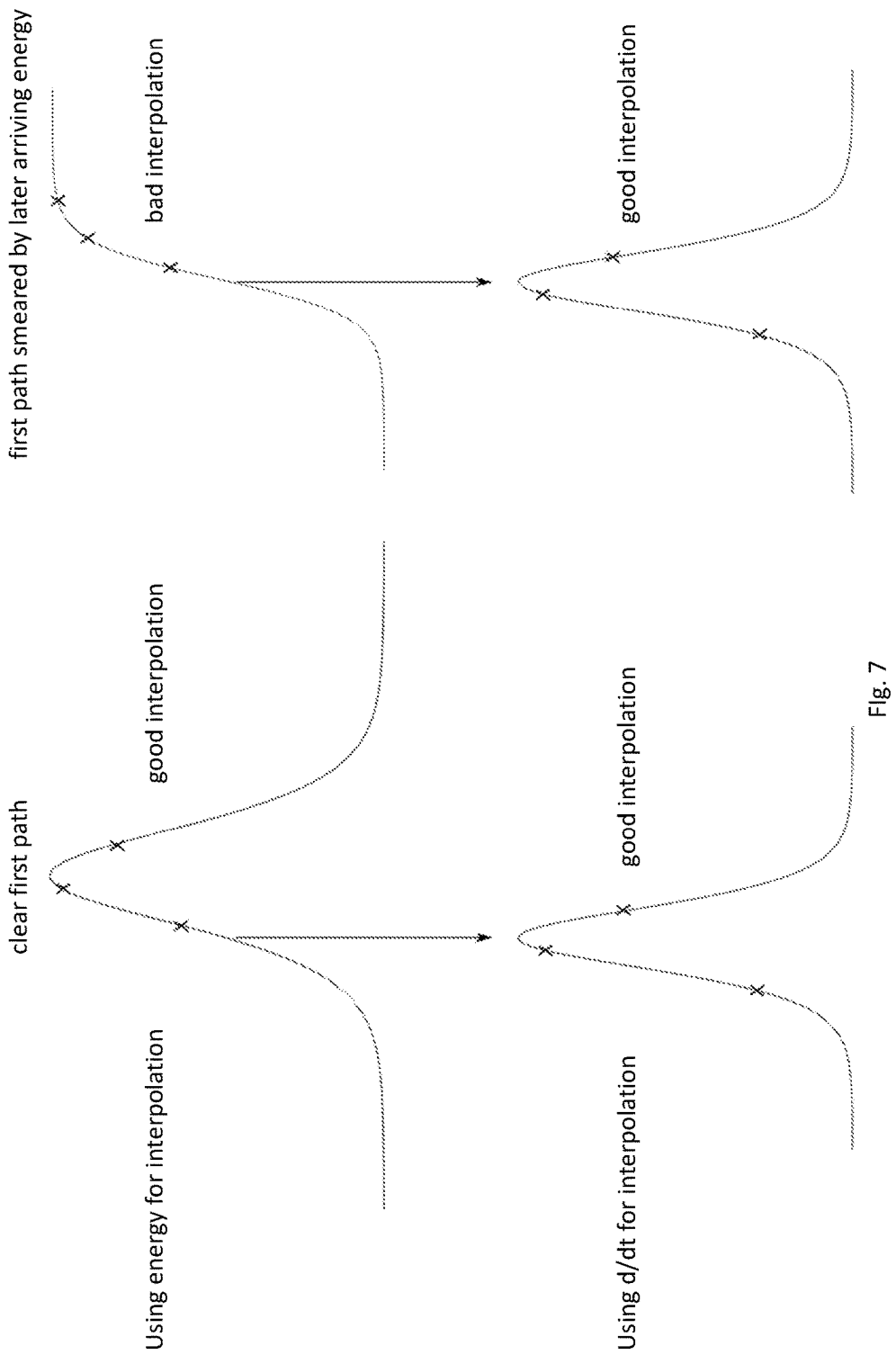
FIG. 7 illustrates, as contrasting waveforms, the effects of later arriving energy corrupting the first path energy.

FIG. 5 illustrates, as a waveform, an example of calculating a first path index using the method described above and shown if FIG. 4. FIG. 6 illustrates, as a waveform, a zoomed view of FIG. 5, beginning at approximately index 710 and ending at approximately index 810.

Although we have described our invention in the context of two alternative embodiments, one of ordinary skill in this art will readily realize that many modifications may be made in such embodiments to adapt either to specific implementations. By way of example, it will take but little effort to adapt our invention to feature match against regular shapes other than an isoceles triangle, e.g., a parabola, a Gaussian function or a derivative of a Gaussian function. Further, the several elements described above may be implemented using any of the various known semiconductor manufacturing methodologies, and, in general, be adapted so as to be operable under either hardware or software control or some combination thereof, as is known in this art.

Thus it is apparent that we have provided an improved method and apparatus for use in the receiver of a UWB communication system to determine the first path. In particular, we submit that our method and apparatus provides performance generally comparable to the best prior art techniques while requiring less circuitry and consuming less power than known implementations of such prior art techniques. Therefore, we intend that our invention encompass all such variations and modifications as fall within the scope of the appended claims.

What we claim is:

1. A method for use in an ultra-wideband (UWB) communication system in which multi-symbol packets are transmitted via a transmission channel and received via an UWB receiver, the method comprising the steps of:

[1] in the receiver, developing an estimate comprising a first set of coefficients of a channel impulse response (CIR) of said transmission channel;
[2] in the receiver, selecting a second set of said coefficients comprising a noise region preceding a leading edge of said CIR;
[3] in the receiver, calculating a first statistic as a function of said first and second sets of coefficients;
[4] in the receiver, calculating a first path threshold as a function of said first statistic;
[5] in the receiver, selecting a first window within said first set of coefficients surrounding a first one of said first set of coefficients having a value above said first path threshold;
[6] in the receiver, developing a peak of a selected shape as a function of a selected set of the coefficients comprising said first window of coefficients; and
[7] in the receiver, selecting as a first path an x-value in said stream of said coefficients corresponding to said peak.

2. The method of claim 1 wherein, in step [6], said shape comprises a selected one of: an isosceles triangle; a parabola; a Gaussian function; and a derivative of a Gaussian function.

3. The method of claim 2 wherein step [6] is further characterized as comprising the steps of:
[6.1] in the receiver, calculating a set of differences between each pair of consecutive coefficients comprising said first window of coefficients; and
[6.2] in the receiver, developing a peak of a selected shape as a function of a selected set of said differences.

4. The method of claim 2 wherein step [6] is further characterized as, in the receiver, developing a peak of a selected shape as a derivative of a function of a selected set of the coefficients comprising said first window of coefficients.

5. The method of claim 1 wherein step [2] is further characterized as comprising the steps of:
[2.1] in the receiver, calculating a second statistic as a function of said first set of coefficients;
[2.2] in the receiver, selecting as a function of said second statistic a second set of said coefficients comprising a noise region preceding a leading edge of said CIR.

6. Apparatus configured to perform the method according to claim 1.

7. A non-transitory computer readable medium including executable instructions which, when executed by a computer, cause the computer to perform a method according to claim 1.

* * * * *